(12) United States Patent
Saito et al.

(10) Patent No.: US 7,755,138 B2
(45) Date of Patent: Jul. 13, 2010

(54) SEMICONDUCTOR DEVICE

(75) Inventors: Wataru Saito, Kanagawa-ken (JP); Syotaro Ono, Kanagawa-ken (JP); Nana Hatano, Kanagawa-ken (JP); Hiroshi Ohta, Hyogo-ken (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/537,219

(22) Filed: Aug. 6, 2009

(65) Prior Publication Data
US 2010/0096692 A1 Apr. 22, 2010

(30) Foreign Application Priority Data
Oct. 16, 2008 (JP) .............................. 2008-267592

(51) Int. Cl.
H01L 29/78 (2006.01)
(52) U.S. Cl. .............................. 257/330; 257/E29.262
(58) Field of Classification Search ................. 257/288, 257/330, 500, 510, E29.262
See application file for complete search history.

(56) References Cited

U.S. PATENT DOCUMENTS

| 7,230,297 B2 | 6/2007 | Ono et al. |
| 7,317,225 B2 * | 1/2008 | Saito et al. .................. 257/341 |
| 7,465,990 B2 * | 12/2008 | Yamauchi et al. ............ 257/341 |
| 7,582,932 B2 * | 9/2009 | Kumar et al. ................ 257/332 |
| 7,595,530 B2 * | 9/2009 | Tokano et al. ............... 257/335 |
| 2005/0287744 A1 | 12/2005 | Ono et al. |
| 2006/0071267 A1 * | 4/2006 | Saito et al. .................. 257/327 |
| 2007/0007589 A1 * | 1/2007 | Nakagawa .................. 257/330 |
| 2007/0114602 A1 | 5/2007 | Saito et al. |
| 2007/0262410 A1 | 11/2007 | Ono et al. |
| 2008/0135929 A1 | 6/2008 | Saito et al. |
| 2009/0206924 A1 * | 8/2009 | Zeng et al. .................. 327/581 |

FOREIGN PATENT DOCUMENTS

| JP | 2000-208527 A | 7/2000 |
| JP | 2001-144306 A | 5/2001 |
| JP | 2005-354037 A | 12/2005 |
| JP | 2007-149736 A | 6/2007 |
| JP | 2007-299970 A | 11/2007 |

* cited by examiner

*Primary Examiner*—Nathan W Ha
(74) *Attorney, Agent, or Firm*—Patterson & Sheridan, LLP

(57) ABSTRACT

A semiconductor device of the invention includes: a super junction structure of an n-type pillar layer and a p-type pillar layer; a base layer provided on the p-type pillar layer; a source layer selectively provided on a surface of the base layer; a gate insulating film provided on a portion being in contact with the base layer, a portion being in contact with the source layer and a portion being in contact with the n-type pillar layer on a portion of a junction between the n-type pillar layer and the p-type pillar layer; a control electrode provided opposed to the base layer, the source layer and the n-type pillar layer through the gate insulating film; and a source electrode electrically connected to the base layer, the source layer and the n-type layer. The source electrode is contact with the surface of the n-type pillar layer located between the control electrodes to form a Schottky junction.

20 Claims, 15 Drawing Sheets

SEMICONDUCTOR DEVICE

CROSS-REFERENCE TO RELATED APPLICATIONS

This application is based upon and claims the benefit of priority from the prior Japanese Patent Application No. 2008-267592, filed on Oct. 16, 2008; the entire contents of which are incorporated herein by reference.

BACKGROUND OF THE INVENTION

1. Field of the Invention

This invention relates to a semiconductor device used in power control.

2. Background Art

The ON resistance of a vertical power MOSFET (Metal Oxide Semiconductor Field Effect Transistor) greatly depends on the electrical resistance of the conduction layer (drift layer). The impurity concentration that determines the electrical resistance of the drift layer cannot be increased above a limit according to the breakdown voltage of the p-n junction formed by the base layer and the drift layer. Therefore, a tradeoff relationship exists between the device breakdown voltage and the ON resistance. It is important to improve this tradeoff in devices of low power consumption. The tradeoff includes a limit determined by the device material. Overcoming this limit leads to the realization of a low ON resistance device superior to existing power devices.

To solve these problems, a known example of a MOSFET includes a p-type pillar layer and an n-type pillar layer buried in the drift layer in a structure called a super junction structure. The super junction structure has the same amount of charge (impurity amount) in the p-type pillar layer and the n-type pillar layer and thereby creates a pseudo-non-doped layer, holds a high breakdown voltage, and passes a current through the highly doped n-type pillar layer to realize a low ON resistance superior to that of the material limit. Thus, the tradeoff between the ON resistance and the breakdown voltage superior to those of the material limit is possible to be achieved based on the super junction structure.

When the power MOSFET is used for a bridge circuit and synchronous rectification or the like, a built-in diode may be operated. Usually, bipolar operation is necessary for large current operation of the diode with low ON voltage. However, if the ON resistance is reduced by using the MOSFET having the super junction structure, the low ON voltage can be achieved in spite of unipolar operation of the built-in diode.

For example, JP-A 2007-299970 (Kokai) discloses a structure of a MOSFET having a built-in Schottky barrier diode (a structure having a MOSFET and a Schottky barrier diode mixed loaded on one chip). However, a region serving as the MOSFET and a region serving as the Schottky barrier diode are formed separately in one chip, causing concern about reducing an effective area of the MOSFET to increase the ON resistance.

SUMMARY OF THE INVENTION

According to an aspect of the invention, there is provided a semiconductor device including: a first semiconductor layer of a first conductivity type; a second semiconductor layer of a first conductivity type provided on a major surface of the first semiconductor layer; a third semiconductor layer of a second conductivity type provided above the major surface of the first semiconductor layer adjacent to the second semiconductor layer, and forming a periodical arrangement structure in conjunction with the second semiconductor layer in a lateral direction generally parallel to the major surface of the first semiconductor layer; a fourth semiconductor layer of a second conductivity type provided on the third semiconductor layer; a fifth semiconductor layer of a first conductivity type selectively provided on a surface of the fourth semiconductor layer; a first main electrode electrically connected to the first semiconductor layer; a gate insulating film provided on a portion being in contact with the fourth semiconductor layer, a portion being in contact with the fifth semiconductor layer and a portion being in contact with the second semiconductor layer; a control electrode provided opposed to the fourth semiconductor layer, the fifth semiconductor layer and the second semiconductor layer through the gate insulating film; and a second main electrode electrically connected to the fourth semiconductor layer, the fifth semiconductor layer and the second semiconductor layer, the second main electrode being in contact with a surface of the second semiconductor layer located between the control electrodes to form a Schottky junction.

DETAILED DESCRIPTION OF THE INVENTION

Figure 1:
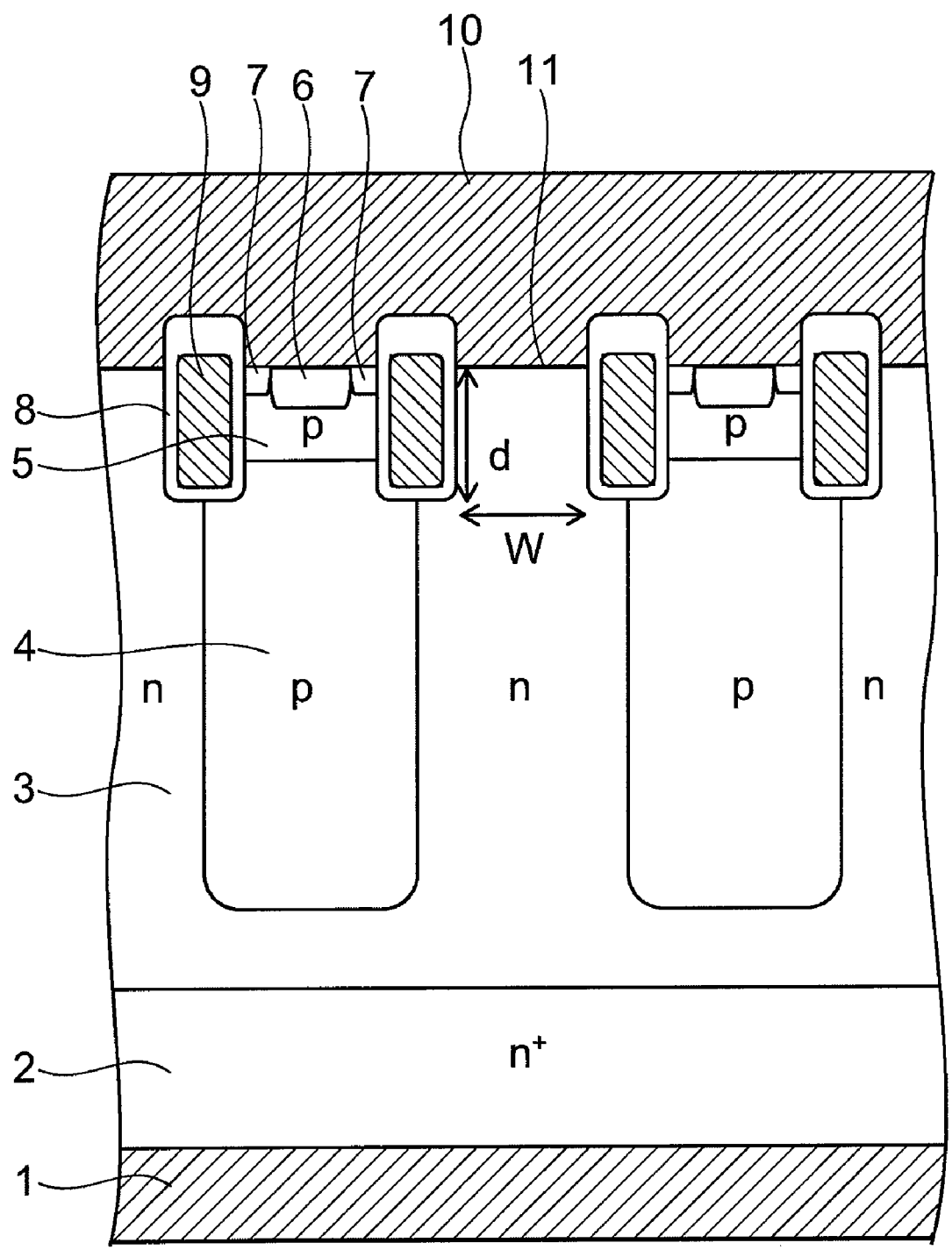
FIGS. 1 and 2 are cross-sectional views of main components of a semiconductor device according to a first embodiment of the invention.

Embodiments of the present invention will now be described with reference to the drawings. In the embodiments below, a first conductivity type is assumed to be an n-type, and a second conductivity type is assumed to be a p-type. Like elements in the drawings are marked with like reference numerals.

First Embodiment

FIG. 1 is a schematic view showing a cross-section of main components of a semiconductor device according to a first embodiment of the invention.

The semiconductor device according to this embodiment is a vertical device having a current path formed in a vertical direction to connect a first main electrode 1 and a second main electrode 10 provided on top and bottom surfaces of a semiconductor layer, respectively. The semiconductor device according to this embodiment includes a cell section in which the current path is formed, and a terminal section formed on an exterior of the cell section so as to surround the cell section. FIG. 1 illustrates part of the cell section. Other drawings from FIG. 2 on down also show part of the cell section.

A drain layer (or a substrate) 2 is provided as a first semiconductor layer made of $n^+$-type silicon having a high impurity concentration. An n-type pillar layer 3, which is a second semiconductor layer made of n-type silicon, and a p-type pillar layer 4, which is a third semiconductor layer made of p-type silicon, are provided on a major surface of the drain layer 2.

The n-type pillar layer 3 and the p-type pillar layer 4 are arranged alternately adjacent (as a p-n junction) and periodically along a lateral direction generally parallel to the major surface of the drain layer 1, forming a so-called "super junction structure."

The planar pattern of the periodical arrangement structure (super junction structure) of the n-type pillar layer 3 and the p-type pillar layer 4 has, for example, a striped configuration, but is not limited thereto, and may be formed in a lattice configuration or a staggered configuration.

A base layer 5 made of p-type silicon is provided on the p-type pillar layer 4 as a fourth semiconductor layer. A source layer 7 made of $n^+$-type silicon as a fifth semiconductor layer and a contact layer 6 made of $p^+$-silicon are selectively provided on a surface portion of the base layer 5.

A trench is formed on a junction interface between the n-type pillar layer 3 and the p-type pillar layer 5, and a control electrode (gate electrode) 9 is provided therein via a gate insulating film 8. That is, a MOS gate section of this embodiment has a trench gate structure. Of a side wall of the trench, the side wall on a p-type pillar layer 4 side from the junction interface between the n-type pillar layer 3 and the p-type pillar layer 4 is in contact with the source layer 7, the base layer 5 and the p-type pillar layer 4, and the side wall on a n-type pillar layer 3 side from the junction interface between the n-type pillar layer 3 and the p-type pillar layer 4 is in contact with the n-type pillar layer 3.

The control electrode 9 is, for example, formed by a planar pattern with a striped configuration like the n-type pillar layer 3 and the p-type pillar layer 4, and provided above the junction interface between the n-type pillar layer 3 and the p-type pillar layer 4. A bottom of the control electrode 9 is opposed to the junction interface between the n-type pillar layer 3 and the p-type pillar layer 4 via the gate insulating film 8. Of a side face portion of the control electrode 9, the side face portion on the p-type pillar layer 4 side from the junction interface between the n-type pillar layer 3 and the p-type pillar layer 4 is opposed to the source layer 7, the base layer 5 and the p-pillar layer 4 via the gate insulating film 8, and the side face portion on the n-type pillar layer 3 from the junction interface between the n-type pillar layer 3 and the p-type pillar layer 4 is opposed to the n-type pillar layer 3 via the gate insulating film 8.

The first main electrode 1 is provided on an opposite face of the major surface of the drain layer 2. The first main electrode 1 is in ohmic contact with the drain layer 2, functions as a drain electrode in the MOSFET, and functions as a cathode electrode in the Schottky barrier diode.

The second main electrode 10 is provided on surfaces of the contact layer 6, the source layer 7 and the n-type pillar layer 3. The second main electrode 10 is insulated from the control electrode 9 by an interlayer insulating film provided on the trench.

The second main electrode 10 is in ohmic contact with the source layer 7 and the contact layer 6, and functions as a source electrode in the MOSFET. The second main electrode 10 located between adjacent control electrodes 9 sandwiching the n-type pillar layer 3 is in contact with the surface of the n-type pillar layer 3 to form a Schottky junction 11 and function as an anode electrode of the Schottky barrier diode.

More specifically, the semiconductor device according to this embodiment has a structure where the MOSFET having a trench gate structure and a super junction structure and the Schottky barrier diode are integrated on one chip, and the MOSFET and the Schottky barrier diode are connected in parallel between the first main electrode 1 and the second main electrode 10.

When prescribed control voltage is applied to the control electrode 9 in a state where electrical potential of the second main electrode 10 is set to be lower than that of the first main electrode 1, a channel (inversion layer) is formed in a portion facing the control electrode 9 of the base layer 5 and the p-type pillar layer 4, and electrons in the ON state of the MOSFET flow from the second main electrode 10 through the source layer 7, the channel, the n-type pillar layer 3 and the drain layer 2 to the first main electrode 1. The above control voltage is enough high for forming the channel (inversion layer) in the base layer 5, the p-type pillar layer 4 has a lower p-type impurity concentration than the base layer 5. Hence, it is possible to form the channel (inversion layer) also in the p-type pillar layer 4 by the above control voltage.

When the MOSFET is OFF, the Schottky barrier diode operates in a state where electrical potential of the second main electrode 10 is set to be higher than that of the first main electrode 1, and a forward electron current flows from the second main electrode 10 through the n-type pillar layer 3 and the drain layer 2 toward the first main electrode 1.

Further, in the super junction structure in the OFF state of the MOSFET, a depletion layer extends from the p-n junction of the n-type pillar layers 3 and the p-type pillar layer 4 in a state where electrical potential of the first main electrode 1 is set to be higher than the second main electrode and the high breakdown voltage can be held.

Here, as a comparative example, forming the base layer 5 and the source layer 7 on the n-type pillar layer 3 makes it impossible to form the Schottky junction 11. Alternatively, when all of the base layer 5, the source layer 7 and the Schottky junction 11 are formed on the surface of the n-type pillar layer 3, the surface region is separated into the region operating as the MOSFET and the region operating as the Schottky barrier diode, and the MOSFET and the Schottky barrier diode cannot share the drift layer, causing reduction of each effective area and increase of the ON resistance.

On the contrary, in this embodiment, the base layer 5 and the source layer 7 are formed on the p-type pillar layer 4, and the Schottky junction 11 is formed on the surface of the n-type pillar layer 3 sandwiching the trench gate therebetween. Thus, in a state where the ohmic contact for operating as the MOSFET and the Schottky junction for operating as the Schottky barrier diode are separated by the trench gate, one n-type pillar layer 3 in a unit cell having a pair of adjacent p-n pillar as a unit serves as a current path (drift layer) of either the MOSFET or the Schottky barrier diode. That is, both structures of the MOSFET and the Schottky barrier diode will be integrated in the unit cell with the super junction structure. Thereby, a cell area included in one chip serves as an effective area for either the MOSFET or the Schottky barrier diode, and then a low ON resistance is obtained with a smaller chip area than in separate formation as different regions. Moreover, the super junction structure is provided, and thus lateral spreading of the drift layer is restricted by the p-type pillar layer 4, thereby a resistance to the spreading of the current flowing vertically is small.

As described above, the Schottky junction 11 is formed on the surface of the n-type pillar layer 3 between the trench gates, and the n-type pillar layer 3 is shared between both of the MOSFET and the Schottky barrier diode as the drift layer. These points are distinctive characters different from the device in which the Schottky barrier diode is built into a vertical power MOSFET having just a trench gate.

Figure 14:
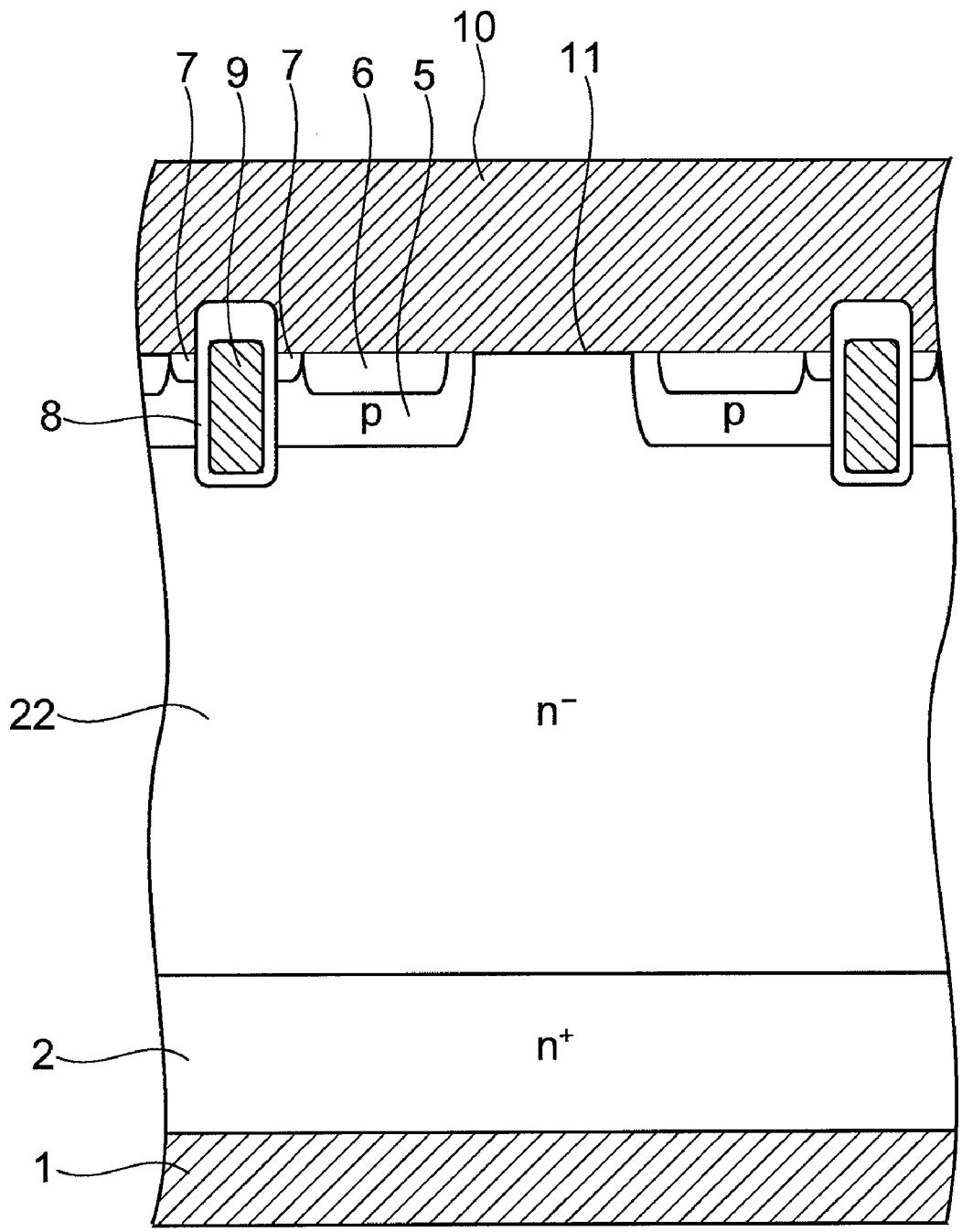
FIG. 14 is a cross-sectional view of main components of a conventional semiconductor device.
Figure 15:
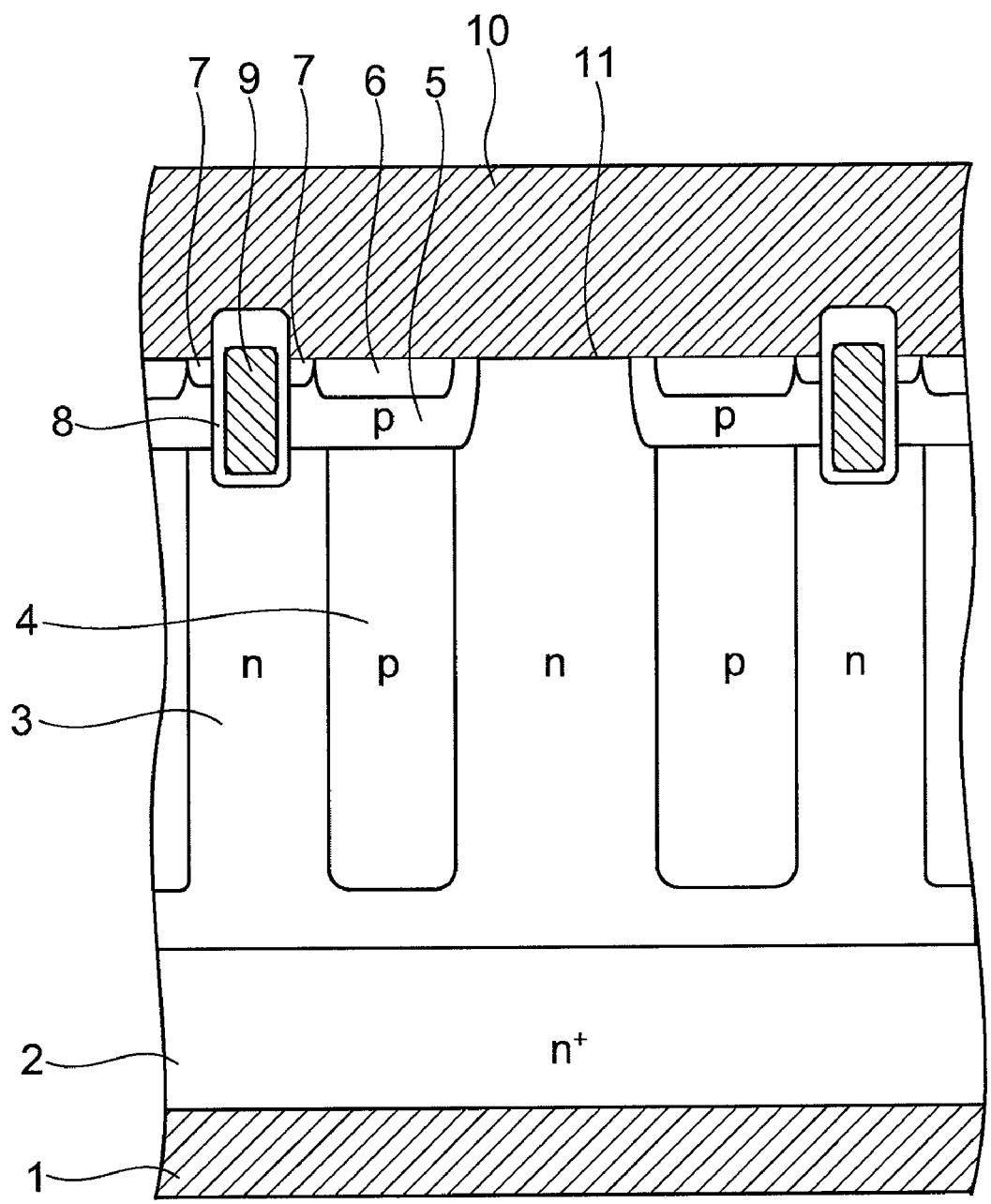
FIG. 15 is a cross-sectional view of main components of another conventional semiconductor device.

For example, a conventional vertical device with a trench gate structure shown in FIG. 14 has a drift layer 22 constituted by an n⁻ layer, and the n⁻-type drift layer 22 is in contact with both of the MOS gate structure and the Schottky electrode. Even when operated by any of the MOSFET and the Schottky barrier diode, both may serve as a current path for electrons spreading through the n⁻-type drift layer 22. Moreover, when this structure is combined with the super junction structure, without ingenuity of disposal of the super junction structure, the MOS gate structure and the Schottky junction, the drift layer (n-type pillar layer 3) of the MOSFET is separated from the drift layer (n-type pillar layer 3) of the Schottky barrier diode as shown in FIG. 15, and then both structures of the MOSFET and the Schottky barrier diode cannot be integrated in the unit cell of the super junction structure.

Therefore, if the MOSFET and the Schottky barrier diode are integrated on one chip without increasing the ON resistance, it is important to dispose each element so that one n-type pillar layer 3 in the unit cell serves as any current path of the MOSFET and the Schottky barrier diode like this embodiment shown in the FIG. 1 described above.

Here, a Schottky barrier diode has a larger inverse leak current than a P-N diode. However, in this embodiment, sandwiching the Schottky junction 11 between the trench gates allows concentration of electric flux lines to the Schottky junction 11 on application of drain voltage to be suppressed (shield effect), and electric field of the Schottky junction 11 to be eased. Thus, it becomes possible to reduce the leak current passing through the Schottky junction 11. Making the trench gate deeper and the width narrower strengthens the shield effect, thus it is preferable that the depth d of the trench is larger than the width W of the Schottky junction 11 (d>W).

Figure 2:
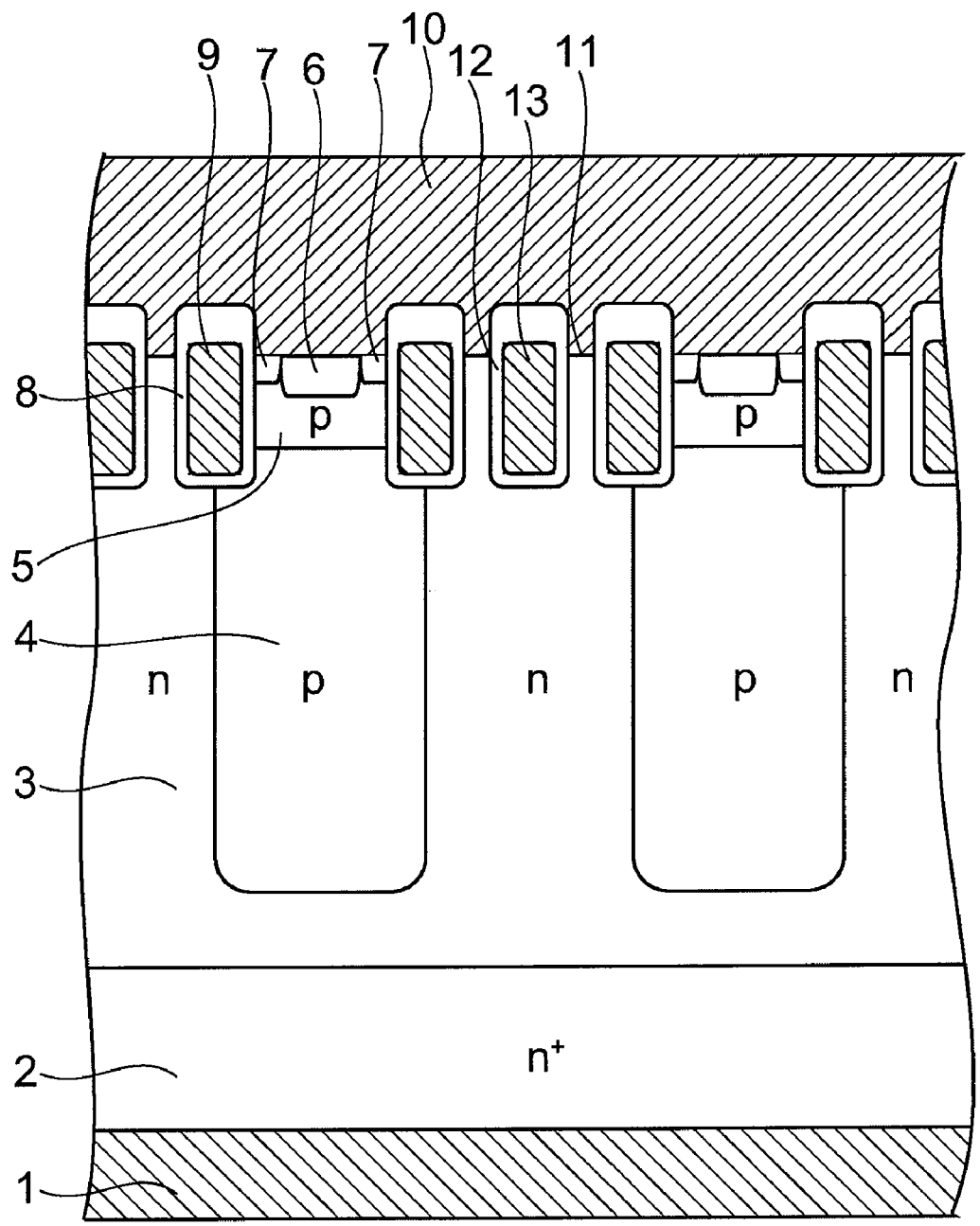

As shown in FIG. 2, the trench is also formed in the superficial portion of the n-type pillar layer 3 between trench gates located on the p-n junction interface in the super junction structure, and thus an embedded electrode 13 may be provided in the trench via an insulating film 12. This structure causes a spacing of the structure having the electrode embedded in the trench narrow, and allows the electric field at the Schottky junction 11 to be eased. The embedded electrode 13 in the trench can be worked, even if connected to the control electrode 9 of the MOSFET, connected to the second main electrode 10, or not connected to any electrode to be floating.

Second Embodiment

Figure 3:
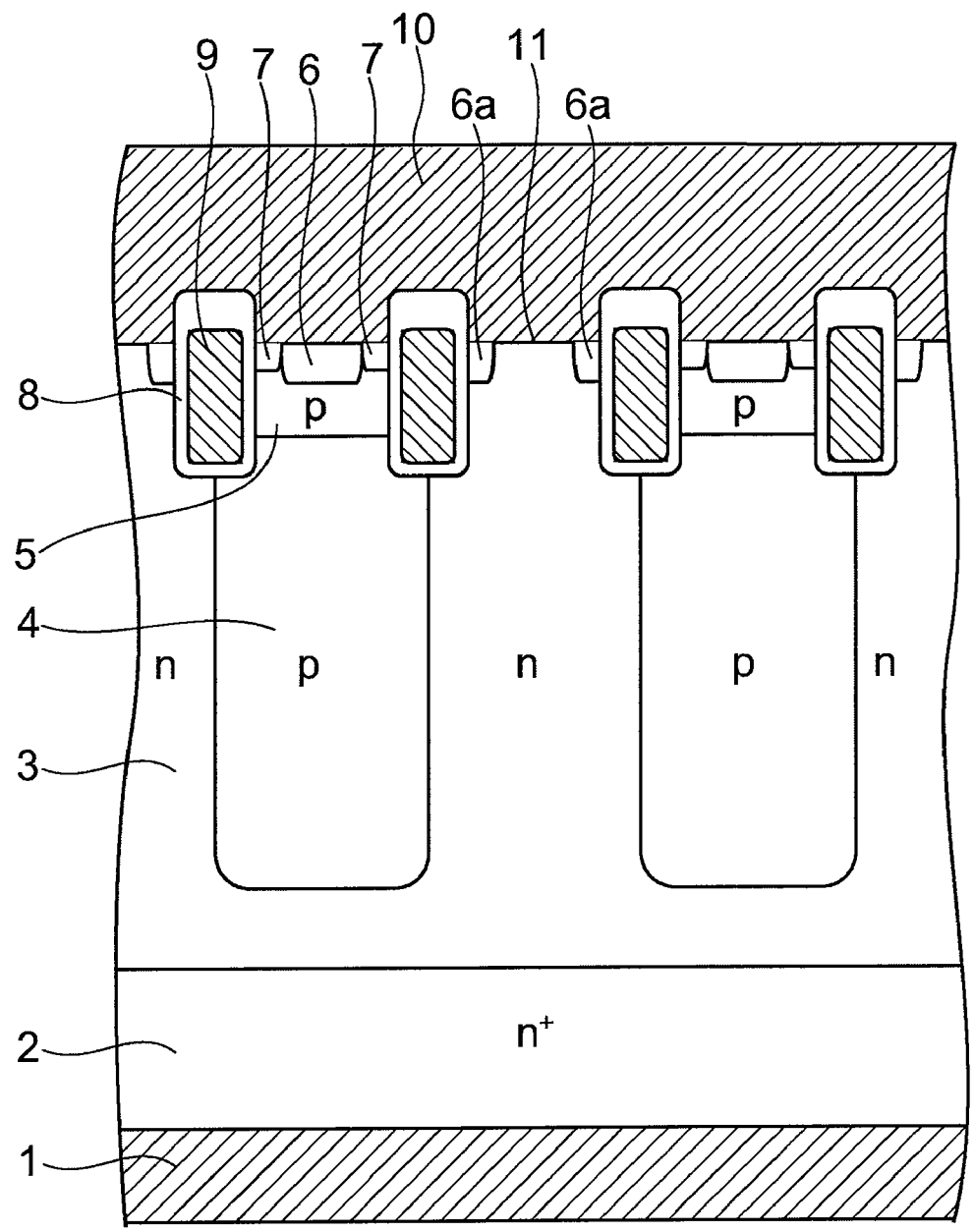
FIG. 3 is a cross-sectional view of main components of a semiconductor device according to a second embodiment of the invention.

FIG. 3 is a cross-sectional view of main components of a semiconductor device according to a second embodiment of the invention.

In the structure shown in FIG. 3, a p⁺-type contact layer 6a is formed so as to be adjacent to the Schottky junction 11, and this contact layer 6a is connected to the second main electrode 10. This structure allows large avalanche withstand capability to be achieved.

On occurrence of avalanche breakdown, an electron and a hole are generated in a drift layer. The generated electron is drained to the first main electrode (drain electrode) 1 and the generated hole is drained to the second main electrode (source electrode) 10. When the hole is drained fast from the p-type base layer 5 through the p⁺-type contact layer 6, a drain resistance of the hole is small. In contrast, when the hole is drained through the Schottky junction 11, a drain resistance of the hole is large. Thus, when the hole generated by the avalanche breakdown flows to the side of the Schottky junction 11, time for drain is long and holes are accumulated. Thereby, the electric field near the Schottky junction 11 becomes large and it fears breakdown of an element.

For this reason, as shown in this embodiment, the hole drain resistance can be reduced by providing the p⁺-type contact layer 6a on the surface of the n-type pillar layer 3 being a drift layer. Thus, the large avalanche withstand capability can be achieved.

Figure 4:
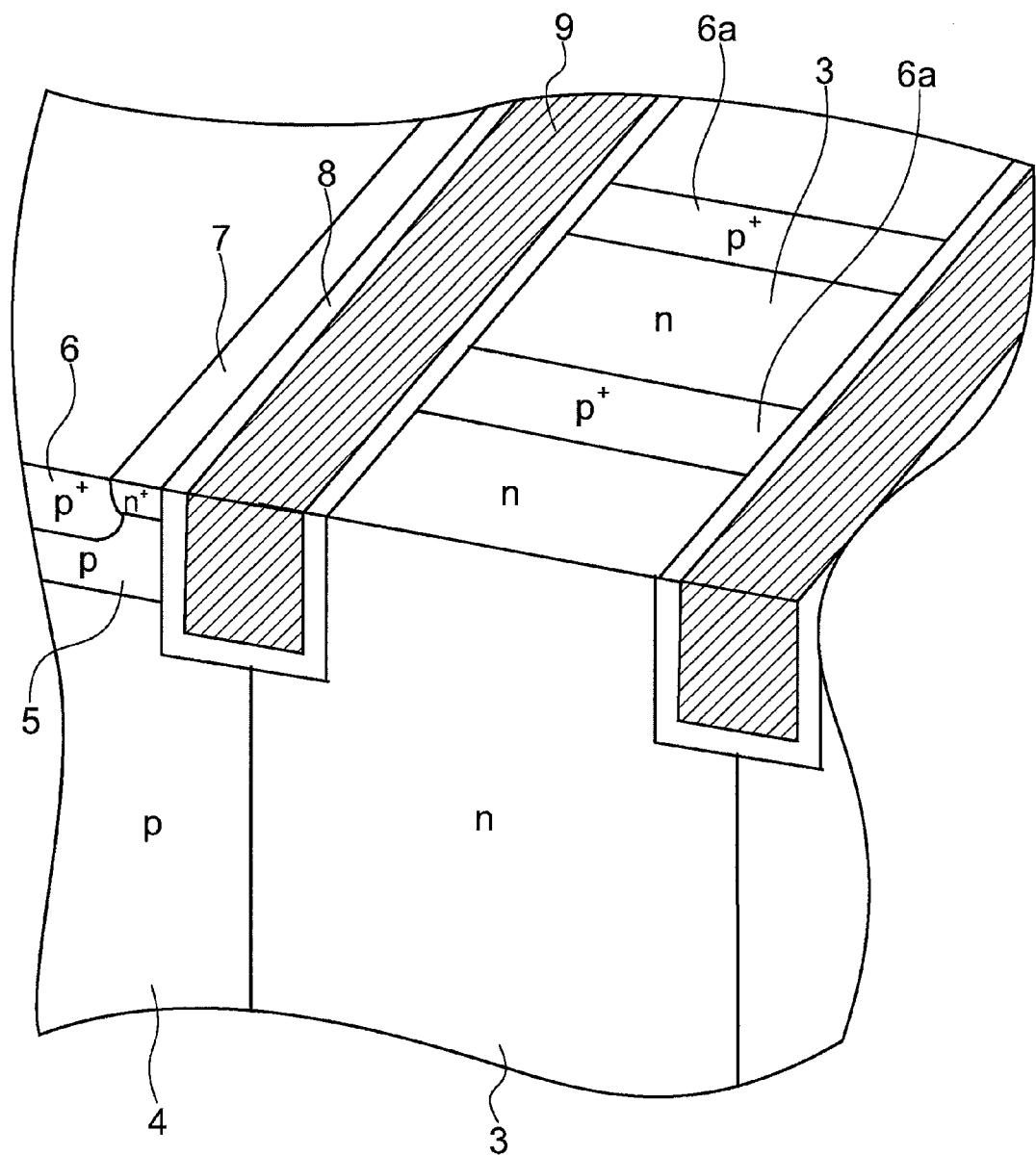
FIG. 4 is a perspective view of main components of the semiconductor device according to the second embodiment of the invention.

Here, when an area of the contact layer 6a on the surface of the n-type pillar layer 3 becomes large, by just that much an area of the Schottky junction 11 becomes small, and then ON voltage of the Schottky barrier diode increases. Then, as shown in FIG. 4, the contact layer 6a is formed selectively on the surface of the n-type pillar layer 3 in a striped configuration orthogonal to the trench gate, thereby it becomes possible to design freely the area and the width of the contact layer 6a and to avoid reduction of the Schottky junction area.

Figure 5:
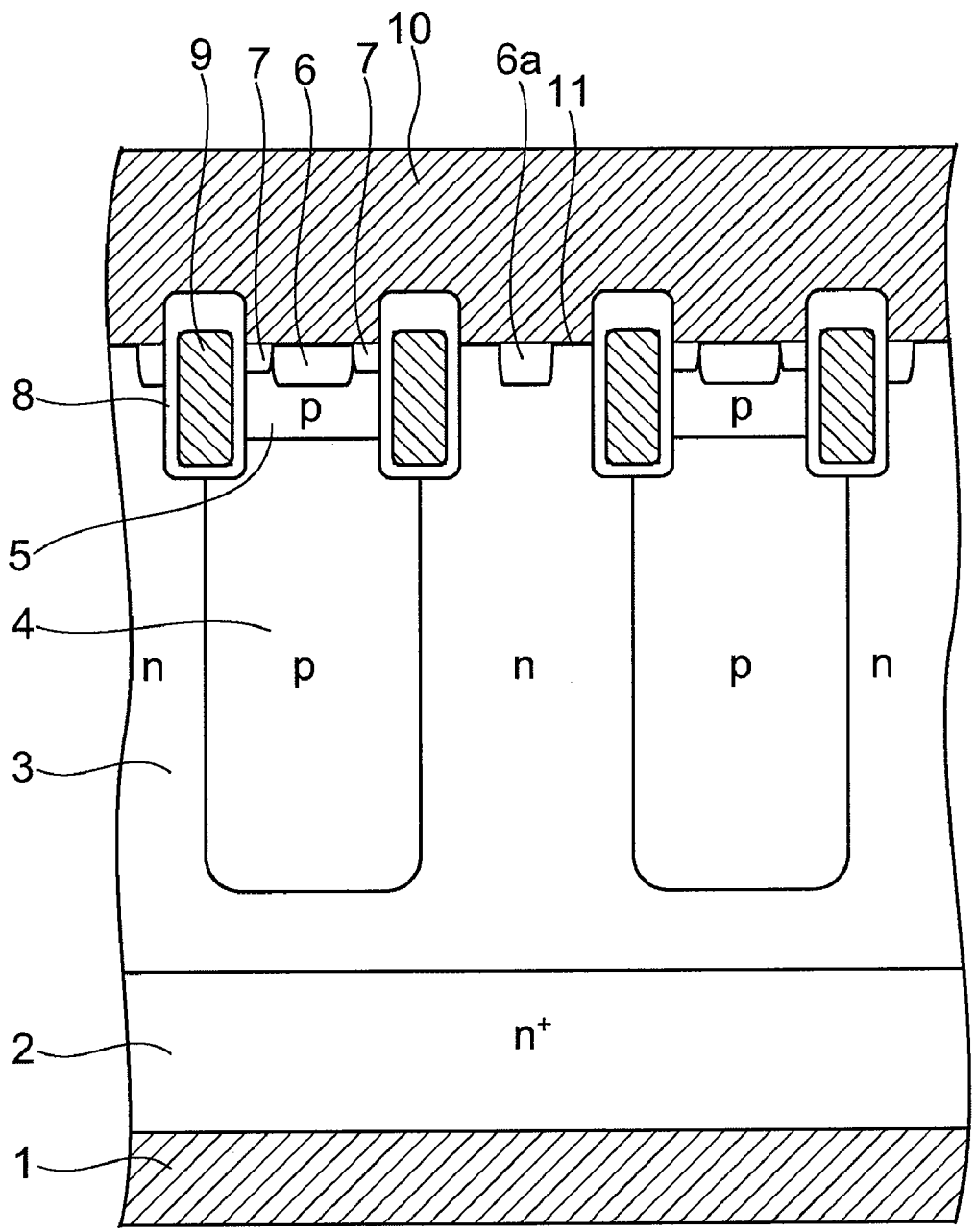
FIGS. 5 and 6 are cross-sectional views of main components of the semiconductor device according to the second embodiment of the invention.

As shown in FIG. 5, the contact layer 6a may be formed at the center of the surface of the p-type pillar layer 3. In this structure, the contact layer 6a is not in contact with the gate insulating film 8. Therefore, impurity ions in the contact layer 6a do not diffuse into the gate insulating film 8 in formation of the gate insulating film 8, and high reliability to the gate insulating film 8 is easy to be achieved.

Figure 6:
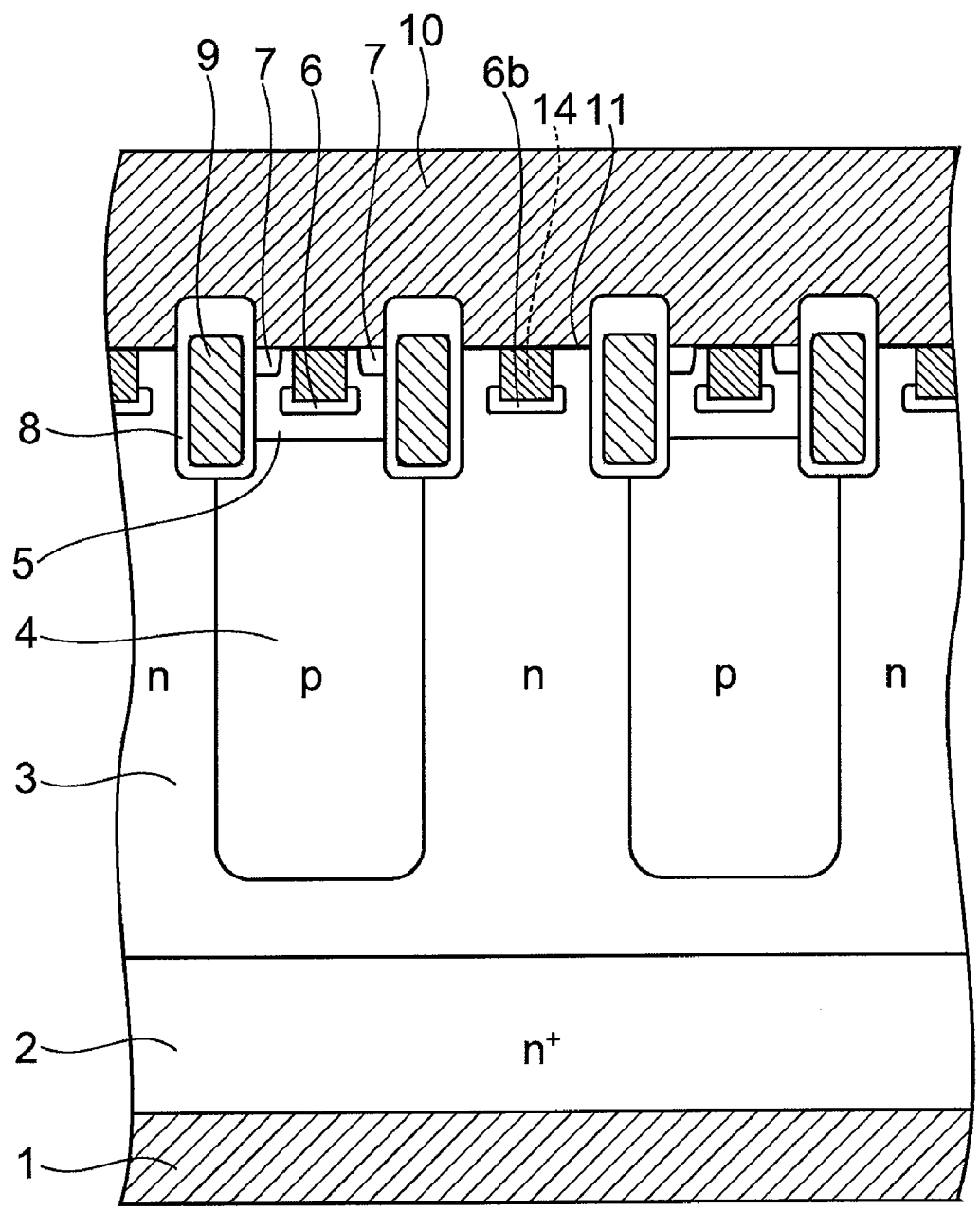

It is also practicable that a structure electrically connecting the base layer 5 to the second main electrode 10 is the trench contact structure shown in FIG. 6. That is, a trench is formed in the base layer 5, the p⁺-type contact layer 6 is formed on the bottom of the trench, and the second main electrode 10 is embedded in the trench, and thus the base layer 5 is electrically connected to the second main electrode 10 via the contact layer 6.

Furthermore, in the structure shown in FIG. 6, a trench 14 is formed in the n-type pillar layer 3 forming the Schottky junction 11 in addition to in the base layer 5, and a p⁺-type contact layer 6b is formed in its bottom. The second main electrode 10 is embedded in the trench 14. Thereby, in this embodiment, hole drain becomes possible through the contact layers 6, 6b and the large avalanche withstand capability is achieved. The contact layer 6 is formed on the bottom of the trench 14, and thus the avalanche breakdown is easy to occur at the p-n junction of the contact layer 6b and the n-type pillar layer 3 but not at the Schottky junction 11. This is also effective for achieving the large avalanche withstand capability.

Third Embodiment

Figure 7:
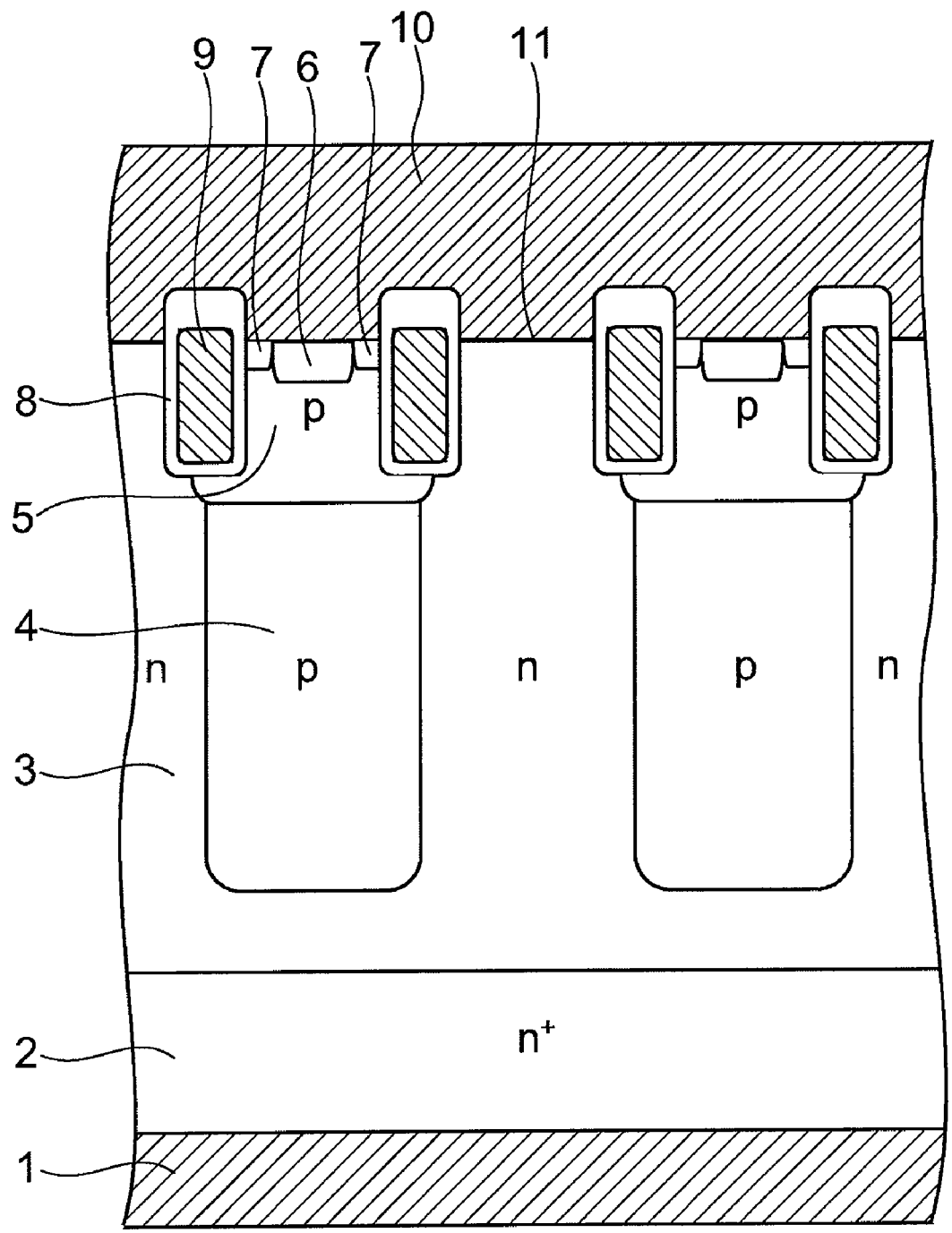
FIGS. 7 and 8 are cross-sectional views of main components of a semiconductor device according to a third embodiment of the invention.

FIG. 7 is a cross-sectional view of main components of a semiconductor device according to a third embodiment of the invention.

In the structure shown in FIG. 7, the base layer 5 is formed deeper than the trench gate and covers part of the gate bottom. This reduces a substantial facing area of the control electrode 9 and the first main electrode (drain electrode) 1, lowers capacitance between the gate and the drain, and then high speed switching becomes possible.

Moreover, the base layer 5 is formed deeply, and thus the avalanche breakdown is easy to occur at the bottom of the base layer 5 but not at the bottom of the trench gate. Therefore, the hole generated by the avalanche breakdown is drained rapidly from the base layer 5 to the second main electrode (source electrode) 10 through the p$^+$-type contact layer 6, and thus the large avalanche withstand capability can be achieved.

Figure 8:
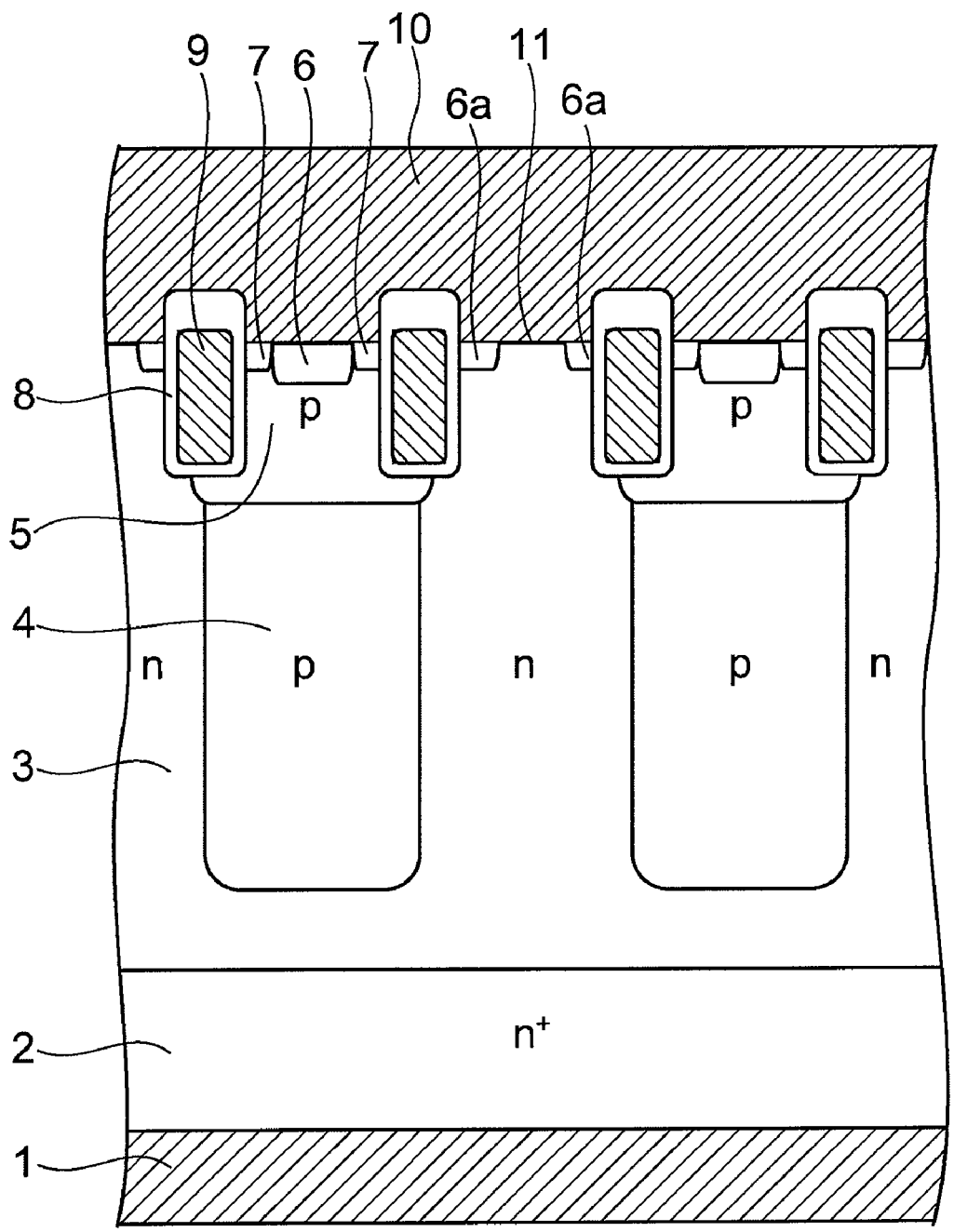

In the structure shown in FIG. 7, furthermore as shown in FIG. 8, the p$^+$-type contact layer 6a is provided on the surface of the n-type pillar layer 3, and thus even if the hole generated by the avalanche breakdown flows into the Schottky junction 11 side, the hole becomes possible to be drained rapidly through the contact layer 6a, and larger avalanche withstand capability can be achieved.

Fourth Embodiment

Figure 9:
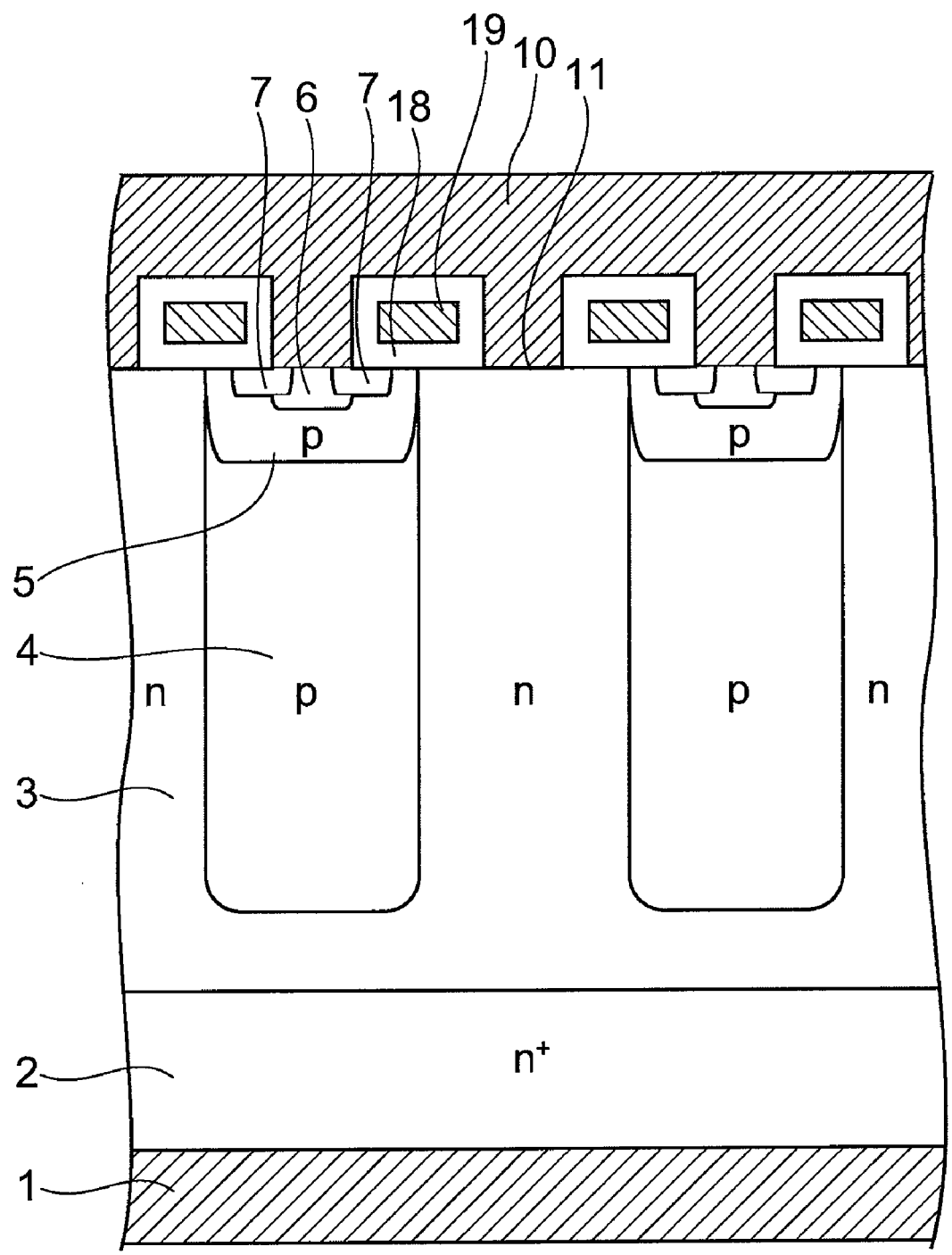
FIGS. 9 and 10 are cross-sectional views of main components of a semiconductor device according to a fourth embodiment of the invention.

FIG. 9 is a cross-sectional view of main components of a semiconductor device according to a fourth embodiment of the invention.

In the structure shown in FIG. 9, the MOS gate structure has a planar gate structure. That is, a gate insulating film 18 is provided on a portion extending from the n-type pillar layer 3 to the source layer 7 through the base layer 5, and a control electrode (gate electrode) 19 is provided on the gate insulating film 18, The control electrode 19 is located on the boundary (p-n junction) between the p-type pillar layer 4 and the n-type pillar layer 3, and the Schottky junction 11 made of the second main electrode 10 and the n-type pillar layer 3 is formed on the surface of the n-type pillar layer 3 between adjacent control electrodes 19 located on this p-n junction. Similar to the embodiment described above, this structure allows a structure integrating the MOSFET with a super junction structure and the Schottky barrier diode in a unit cell to be realized while maintaining a low ON resistance. That is, also in this embodiment, it is possible to make one n-type pillar layer 3 in the unit cell operate as a drift layer common to both of the MOSFET and the Schottky barrier diode.

The planar gate structure reduces the electric field at an end portion of the control electrode 19 in comparison with the trench gate structure and high gate reliability is achieved.

Figure 10:
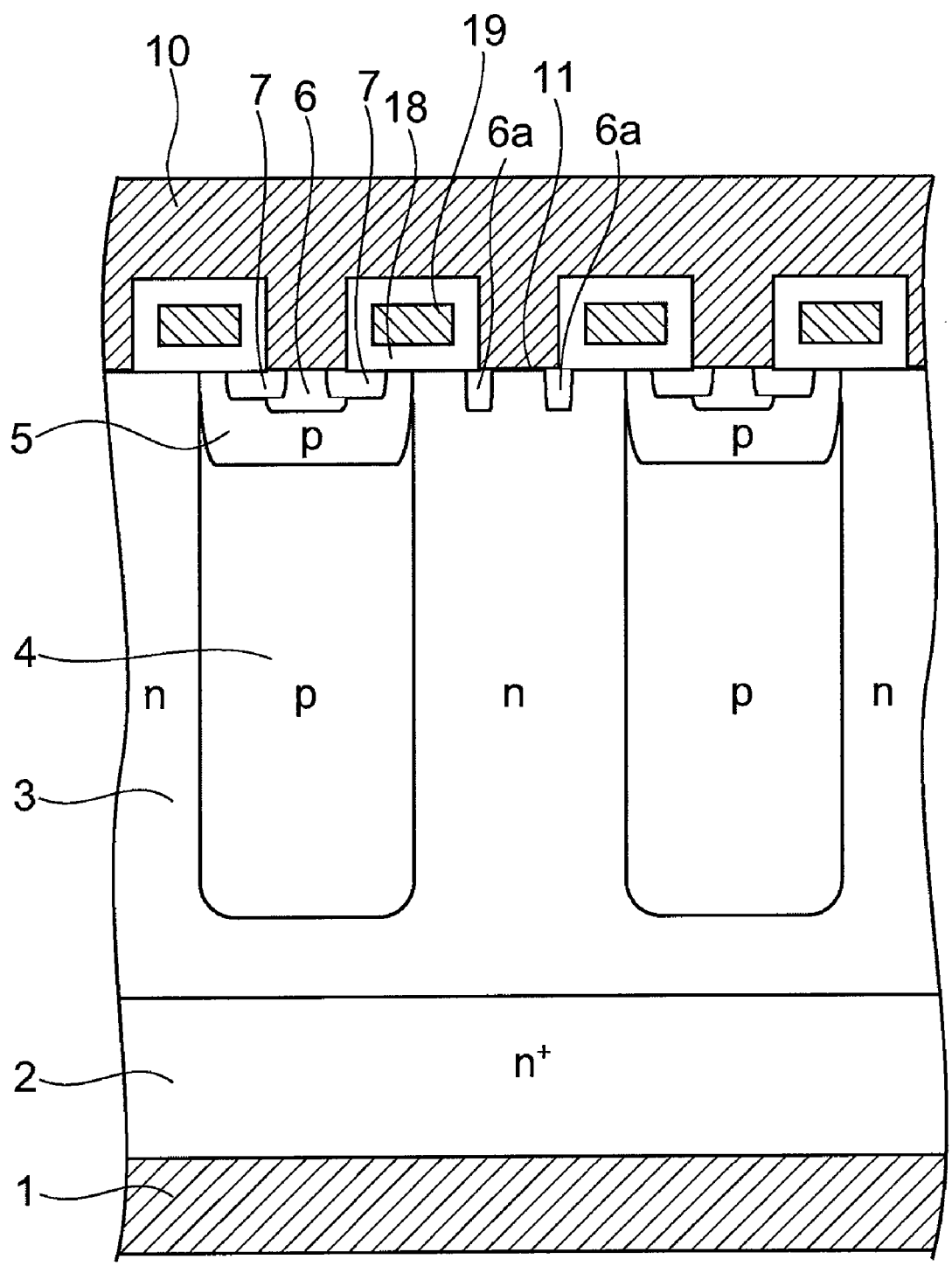

In the structure shown in FIG. 9, furthermore as shown in FIG. 10, the p$^+$-type contact layer 6a is added on the surface of the n-type pillar layer 3, and thus it is possible to reduce the electric field at the end of the control electrode 19. Moreover, it becomes possible to drain the hole generated on application of high voltage from the contact layer 6a and the large avalanche withstand capability can be achieved.

Fifth Embodiment

Figure 11:
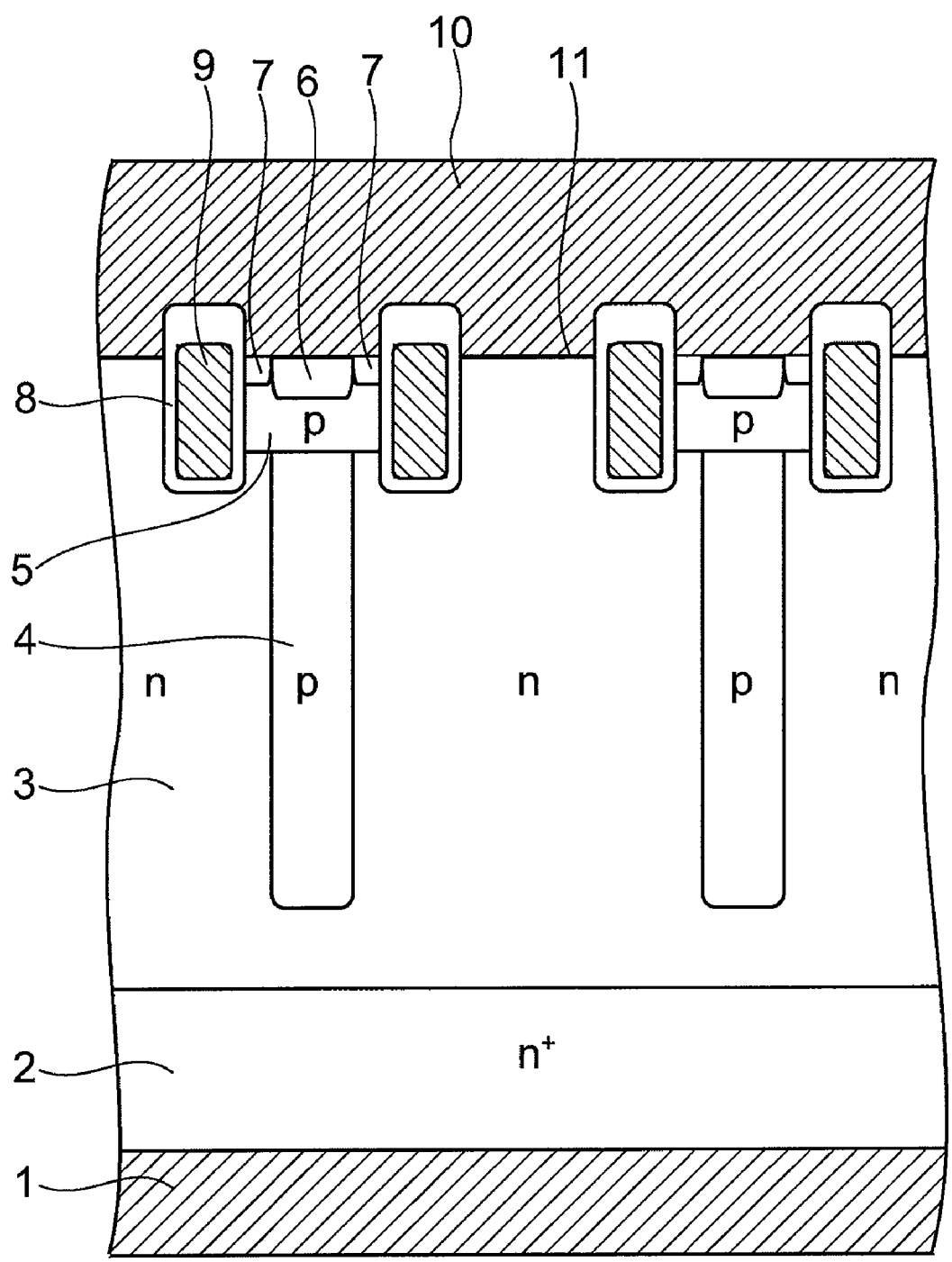
FIGS. 11 and 12 are cross-sectional views of main components of a semiconductor device according to a fifth embodiment of the invention.

FIG. 11 is a cross-sectional view of main components of a semiconductor device according to a fifth embodiment of the invention.

In the structure shown in FIG. 11, the trench structure is not formed at the boundary between the p-type pillar layer 4 and the n-type pillar layer 3, and the width of the p-type pillar layer 4 is narrower than that of the n-type pillar layer. As for this structure, one n-type pillar layer 3 of the unit cell is shared between the MOSFET and the Schottky barrier diode to form an integrated structure, hence the same effect as the above embodiments is obtained. However, in this structure, the width of the n-type pillar layer 3 is broad, and a resistance for broadening a current path is generated, thereby structures of above respective embodiments have a lower ON resistance.

Figure 12:
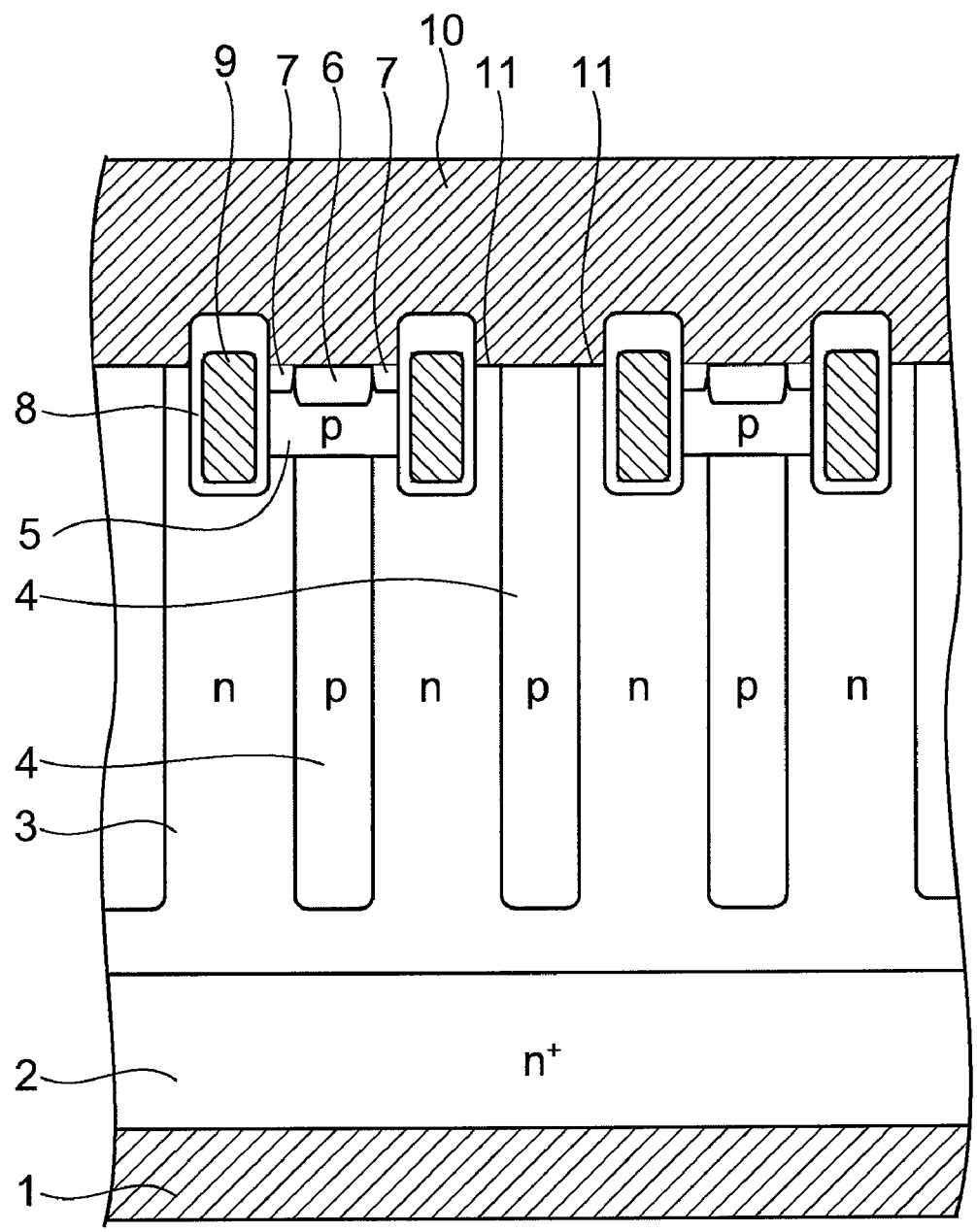

As shown in FIG. 12, the p-type pillar layer 4 is provided not only under the base layer 5 but also in the n-type pillar layer 3 between the trench gates, and a lateral period of the super junction structure is ½ times of a lateral period of the base layer 5, and thereby the ON resistance can be reduced. That is, narrowing the lateral period of the super junction structure allows an impurity concentration in the p-type pillar layer 4 and the n-type pillar layer 3 to be higher, and thereby the low ON resistance can be achieved.

As for this structure, one n-type pillar layer 3 of the unit cell is shared between the MOSFET and the Schottky barrier diode to form an integrated structure, hence the same effect as the above embodiments is achieved.

Figure 13:
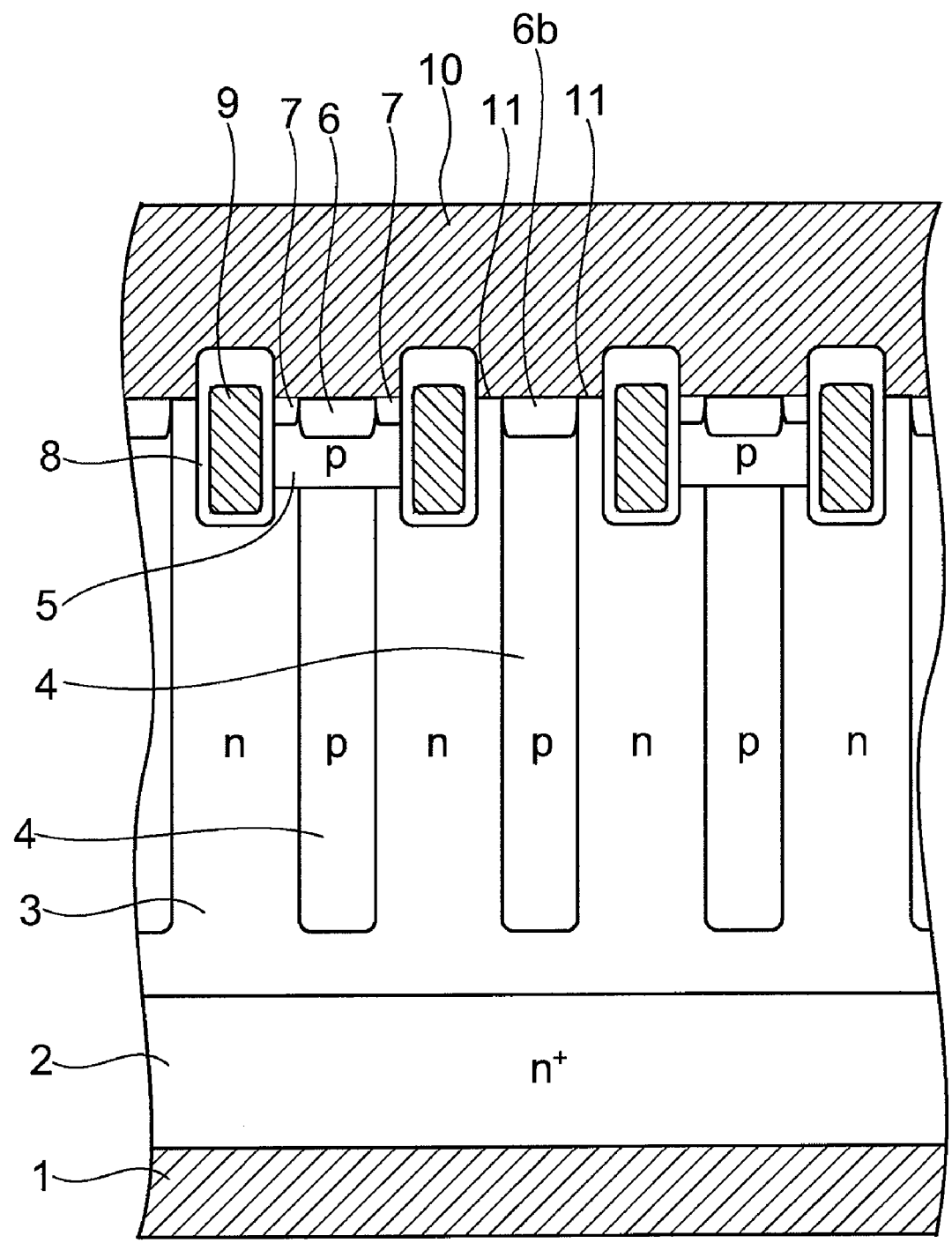
FIG. 13 is a cross-sectional view of main components of a semiconductor device according to the fifth embodiment of the invention.

In the structure in FIG. 12, furthermore as shown in FIG. 13, the p$^+$-type pillar layer 6b is formed in the superficial portion of the p-type pillar layer 4 not existing below the base layer 5, and thereby it becomes possible to drain the hole generated by the avalanche breakdown on application of high voltage through the contact layer 6b and the large avalanche withstand capability can be achieved.

Even if the avalanche breakdown does not occur, the pi-type pillar layer 4 is depleted by application of high voltage. At the time of forward recovery of the Schottky barrier diode to forward bias, hole supply is needed for releasing the depletion of the p-type pillar layer 4. However, formation of the above contact layer 6b reduces a contact resistance between the p-type pillar layer 4 and the second main electrode (source electrode) 10, and realizes rapid hole supply from the second main electrode 10. This reduces the ON voltage rapidly at the forward recovery of the Schottky barrier diode, and can realize low recovery loss.

The embodiment of the invention has been described with reference to the specific examples. However, the invention is not limited thereto, but can be variously modified in accordance with the spirit of the invention.

For example, in the embodiment describe above, the description has been made under that the first conductivity type is the n-type and the second conductivity type is the p-type, however, the invention can be practiced also under that the first conductivity type is the p-type and the second conductivity type is the n-type.

The plane pattern of the MOS gate section and the super junction structure may be formed in a lattice, a staggered, or a hexagonal configuration without limit to a striped configuration.

A structure of the device edge termination portion is not particularly described, however, any edge termination structure such as a RESURF (Reduced SURface Field) structure and a guard ring structure can be used for implement.

Moreover, even if the bottom of the p-type pillar layer 4 is in contact with the drain layer 2, the similar effect is achieved. Even if a layer containing a lower impurity concentration than the n-type pillar layer 3 is inserted between the super junction structure and the drain layer 2, implement is possible similarly.

The MOSFET based on silicon (Si) as a semiconductor has been described, however, the semiconductor can be illustratively based on a compound semiconductor such as silicon carbide (SiC) and gallium nitride (GaN), and a wide gap semiconductor such as diamond.

The invention claimed is:
1. A semiconductor device comprising:
a first semiconductor layer of a first conductivity type;
a second semiconductor layer of a first conductivity type provided on a major surface of the first semiconductor layer;

a third semiconductor layer of a second conductivity type provided above the major surface of the first semiconductor layer adjacent to the second semiconductor layer, and forming a periodical arrangement structure in conjunction with the second semiconductor layer in a lateral direction generally parallel to the major surface of the first semiconductor layer;

a fourth semiconductor layer of a second conductivity type provided on the third semiconductor layer;

a fifth semiconductor layer of a first conductivity type selectively provided on a surface of the fourth semiconductor layer;

a first main electrode electrically connected to the first semiconductor layer;

a gate insulating film provided on a portion being in contact with the fourth semiconductor layer, a portion being in contact with the fifth semiconductor layer and a portion being in contact with the second semiconductor layer;

a control electrode provided opposed to the fourth semiconductor layer, the fifth semiconductor layer and the second semiconductor layer via the gate insulating film; and a second main electrode electrically connected to the fourth semiconductor layer, the fifth semiconductor layer and the second semiconductor layer, the second main electrode being in contact with a surface of the second semiconductor layer located between the control electrodes to form a Schottky junction.

2. The device according to claim 1, wherein the control electrode is provided above a junction interface between the second semiconductor layer and the third semiconductor layer via the gate insulating film.

3. The device according to claim 1, wherein the gate insulating film and the control electrode are provided in a trench formed in contact with the fourth semiconductor layer, the fifth semiconductor layer and the second semiconductor layer.

4. The device according to claim 3, wherein the second main electrode is in contact with the surface of the second semiconductor layer with a width narrower than a depth of the trench.

5. The device according to claim 3, wherein a sixth semiconductor layer of a second conductivity type is selectively provided on the surface of the second semiconductor layer.

6. The device according to claim 5, wherein the sixth semiconductor layer is provided at a center of the surface of the second semiconductor layer and not in contact with the gate insulating film.

7. The device according to claim 1, wherein the gate insulating film and the control electrode are provided in a trench formed in contact with the fourth semiconductor layer, the fifth semiconductor layer and the second semiconductor layer, a sixth semiconductor layer of a second conductivity is selectively provided on the surface of the second semiconductor layer, and the trench and the sixth semiconductor layer are formed in a striped configuration orthogonal to each other.

8. The device according to claim 1, wherein the gate insulating film and the control electrode are provided in a trench formed in contact with the fourth semiconductor layer, the fifth semiconductor layer and the second semiconductor layer, and a bottom depth of the fourth semiconductor layer is larger than a bottom depth of the trench.

9. The device according to claim 8, wherein a sixth semiconductor layer of a second conductivity type is selectively provided on the surface of the second semiconductor layer.

10. The device according to claim 1, wherein the gate insulating film and the control electrode are provided in a first trench formed in contact with the fourth semiconductor layer, the fifth semiconductor layer and the second semiconductor layer, and a second trench is provided on a superficial portion of the second semiconductor layer.

11. The device according to claim 10, wherein the same material as the gate insulating film and the control electrode is embedded inside the second trench.

12. The device according to claim. 10, wherein a sixth semiconductor layer of a second conductivity type is provided on a bottom of the second trench, and the second main electrode is embedded inside the second trench.

13. The device according to claim 1, wherein the gate insulating film and the control electrode include a planar gate structure.

14. The device according to claim 13, wherein a sixth semiconductor layer of a second conductivity type is selectively provided on the surface of the second semiconductor layer.

15. The device according to claim 1, wherein a width of the third semiconductor layer is narrower than a width of the second semiconductor layer.

16. The device according to claim 15, wherein a lateral period of the third semiconductor layer is ½ times of a lateral period of the fourth semiconductor layer, and the third semiconductor layer not in contact with the fourth semiconductor layer is in contact with the second main electrode.

17. The device according to claim 16, wherein a seventh semiconductor layer of a second conductivity type is provided on a surface of the third semiconductor layer in contact with the second main electrode.

18. The device according to claim 17, wherein the seventh semiconductor layer has a higher second conductivity type impurity concentration than the third semiconductor layer.

19. The device according to claim 1, wherein a transistor including the fourth semiconductor layer and the fifth semiconductor layer and a Schottky barrier diode including the Schottky junction are connected in parallel between the first main electrode and the second main electrode.

20. The device according to claim 19, wherein one of the second semiconductor layer in a unit cell of the periodical arrangement structure made of the second semiconductor layer and the third semiconductor layer is shared between the transistor and the Schottky barrier diode as a drift layer.

* * * * *